(12) United States Patent
Ogo

(10) Patent No.: US 7,646,042 B2
(45) Date of Patent: Jan. 12, 2010

(54) CHARGE COUPLED DEVICE AND SOLID-STATE IMAGING APPARATUS

(75) Inventor: Takahiko Ogo, Hashima (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 268 days.

(21) Appl. No.: 11/334,364

(22) Filed: Jan. 19, 2006

(65) Prior Publication Data

US 2006/0163620 A1 Jul. 27, 2006

(30) Foreign Application Priority Data

Jan. 24, 2005 (JP) .............................. 2005-015197

(51) Int. Cl.
*H01L 31/062* (2006.01)
(52) U.S. Cl. .................. 257/239; 257/240; 257/291; 257/292; 257/E27.133
(58) Field of Classification Search ............... 438/60, 438/75, 144; 257/240, 241, 239, 249, 291, 257/292, E27.13, E27.133
See application file for complete search history.

(56) References Cited

U.S. PATENT DOCUMENTS 4,612,580 A 9/1986 Weimer

| | | | |
|---|---|---|---|
| 6,426,238 B1 * | 7/2002 | Morimoto | 438/52 |
| 6,933,976 B1 * | 8/2005 | Suzuki | 348/315 |
| 2002/0003611 A1 * | 1/2002 | Ohashi | 353/31 |
| 2003/0213983 A1 * | 11/2003 | Tsunai | 257/215 |
| 2004/0263657 A1 * | 12/2004 | Sakamoto et al. | 348/311 |

FOREIGN PATENT DOCUMENTS

EP 420764 A2 * 4/1991

\* cited by examiner

*Primary Examiner*—Minh-Loan T Tran
(74) *Attorney, Agent, or Firm*—Oliff & Berridge, PLC

(57) ABSTRACT

When capacity coupling between an output gate electrode (OG) and a last-stage transfer electrode is large at an output end of a CCD shift register, an electric potential of the OG is varied according to transfer clocks with the result that noise is liable to generate in an output signal. As measures for this, convex portions projecting horizontally are formed in those positions of the last-stage transfer electrode and the OG, which correspond to a channel region, and overlap between the electrodes is caused only on the convex portions. A clearance is formed between the OG and the transfer electrode except those locations, in which the convex portions are provided. In that location, in which the OG and the transfer electrode, respectively, are extended relatively lengthily toward wirings, the electrodes do not overlap each other. In this manner, capacity coupling between the electrodes is reduced.

4 Claims, 3 Drawing Sheets

CHARGE COUPLED DEVICE AND SOLID-STATE IMAGING APPARATUS

FIELD OF THE INVENTION

The present invention relates to a charge coupled device (CCD) and a CCD image sensor, and more particular, to noise reduction at the time of charge transfer.

BACKGROUND OF THE INVENTION

CCD comprises a channel region (charge transfer channel region) formed on a surface of a semiconductor substrate, and a plurality of transfer electrodes arranged in the channel region along a direction of charge transfer. Adjacent transfer electrodes are formed by using, for example, two layers of polysilicon to enable boundaries thereof to overlap each other whereby a fringe electric field is preferably generated below the boundaries of the transfer electrodes and an improvement in charge transfer efficiency is achieved.

An explanation is given to the prior art by taking up a horizontal shift register of a CCD image sensor as an example of a conventional CCD. FIG. 1 is a schematic plan view showing the structure, on an output end side, of a horizontal shift register of a conventional CCD image sensor. The horizontal shift register is driven at two-phase transfer clocks $\phi 1$, $\phi 2$, and two aluminum (Al) wirings 4, 6 arranged along a channel region 2 supply the transfer clocks $\phi 1$, $\phi 2$ to transfer electrodes.

Electrodes formed from a first layer polysilicon (referred below to as 1st poly-Si) and electrodes formed from a second layer polysilicon (referred below to as 2nd poly-Si) are arranged as transfer electrodes alternately along the channel region 2, and the two adjacent transfer electrodes are paired to correspond to one transfer clock. 2nd poly-Si electrodes 8 formed after formation of 1st poly-Si electrodes 10 are caused to overlap respective edges of the 1st poly-Si electrodes 10 on both ends thereof so that misalignment in lithography generates no gap between the 2nd poly-Si electrodes and adjacent 1st poly-Si electrodes 10.

The horizontal shift register comprises a main portion 12 and an extension 14. The main portion 12 receives signal charges transferred vertically from an imaging portion. The extension 14 is connected to an end of the main portion 12 and is gradually narrowed in channel width. An output end of the extension 14 is connected to an output portion 16.

The output portion 16 comprises a floating diffusion (FD) 18, of which electric potential is varied according to a quantity of signal charge transferred from the horizontal shift register. An output gate electrode (OG) 20 is arranged between the last-stage transfer electrode 10, to which transfer clock of the horizontal shift register is applied, and the FD 18. The OG 20 is made of polysilicon and formed into an elongate shape extending alongside of the transfer electrode 10 to be connected to an Al wiring 22. Here, the OG 20 is made of 2nd poly-Si so as to restrict a gap between it and an adjacent transfer electrode 10 made of 1st poly-Si, and structured so that an edge thereof on a side of the last-stage transfer electrode 10 overlaps the transfer electrode 10. The OG 20 is applied by a certain electric potential to maintain channel electric potential therebelow constant. The channel electric potential is set to be shallower than reset electric potential of the FD 18, and a maximum quantity of signal charge being able to be stored in the FD 18 is determined according to a difference between channel electric potential below the OG 20 and reset electric potential of the FD 18.

The transfer electrodes of the CCD shift register such as the electrodes 8, 10 and the OG 20 are extended even outside the channel region. In particular, a distance between the channel region and the wirings, through which voltage is applied to the transfer electrodes, is liable to be increased in that portion of the channel region, which is narrowed in channel width, and lengths, by which the transfer electrodes are extended outside the channel region, are correspondingly increased. With a conventional structure, adjacent transfer electrodes overlap each other also outside a channel region and capacity between the transfer electrodes is increased correspondingly. Therefore, the problem caused is that when transfer clock is applied to a certain transfer electrode, even a channel electric potential below adjacent transfer electrodes is dragged to vary. The problem specifically appears as inconveniences such as deterioration of a CCD shift register in transfer efficiency, reduction in charge handling capacity, and noise increase.

In particular, overlap of that last-stage transfer electrode, to which transfer clock is applied, and an OG causes variation in channel electric potential below the OG according to the transfer clock and can cause variation in maximum quantity of signal charge being able to be stored in a FD, and variation in capacitance of the FD. Consequently, the problem caused is that noise is liable to be generated in output signal taken out by means of the FD on the basis of the quantity of signal charge.

SUMMARY OF THE INVENTION

The invention enables an improvement in characteristics of a CCD shift register with respect to the problems described above.

The invention provides a CCD comprising a charge transfer channel region formed on a surface of a semiconductor substrate, and a first transfer electrode and a second transfer electrode, respectively, which intersect the charge transfer channel region, comprise a portion that overlaps mutually, and are arranged adjacent to each other to control electric potential in the charge transfer channel region, and wherein the overlap portion is selectively formed in a position corresponding to the charge transfer channel region with respect to a direction of channel width.

According to the invention, since overlap of a first transfer electrode and a second transfer electrode adjacent thereto outside a channel region is limited, capacity coupling between the electrodes is reduced. Consequently, influences on channel electric potential below adjacent transfer electrodes when transfer clock is applied to a certain transfer electrode are reduced.

DESCRIPTION OF THE PREFERRED EMBODIMENT(S)

An embodiment (referred below to as embodiment) of the invention will be described below with reference to the drawings.

Figure 1:
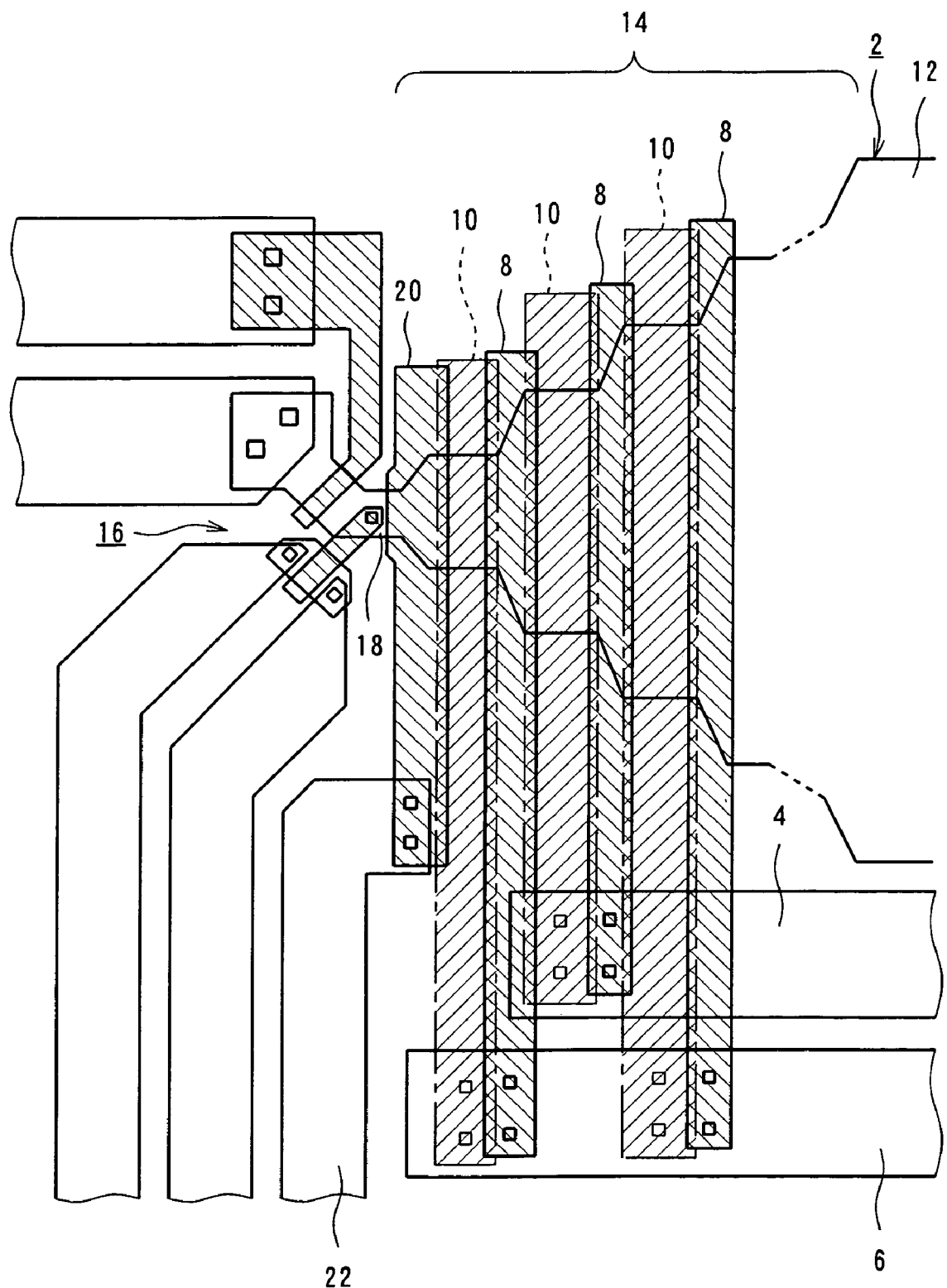
FIG. 1 is a schematic plan view showing the structure, on an output end side, of a horizontal shift register of a conventional CCD image sensor.
Figure 2:
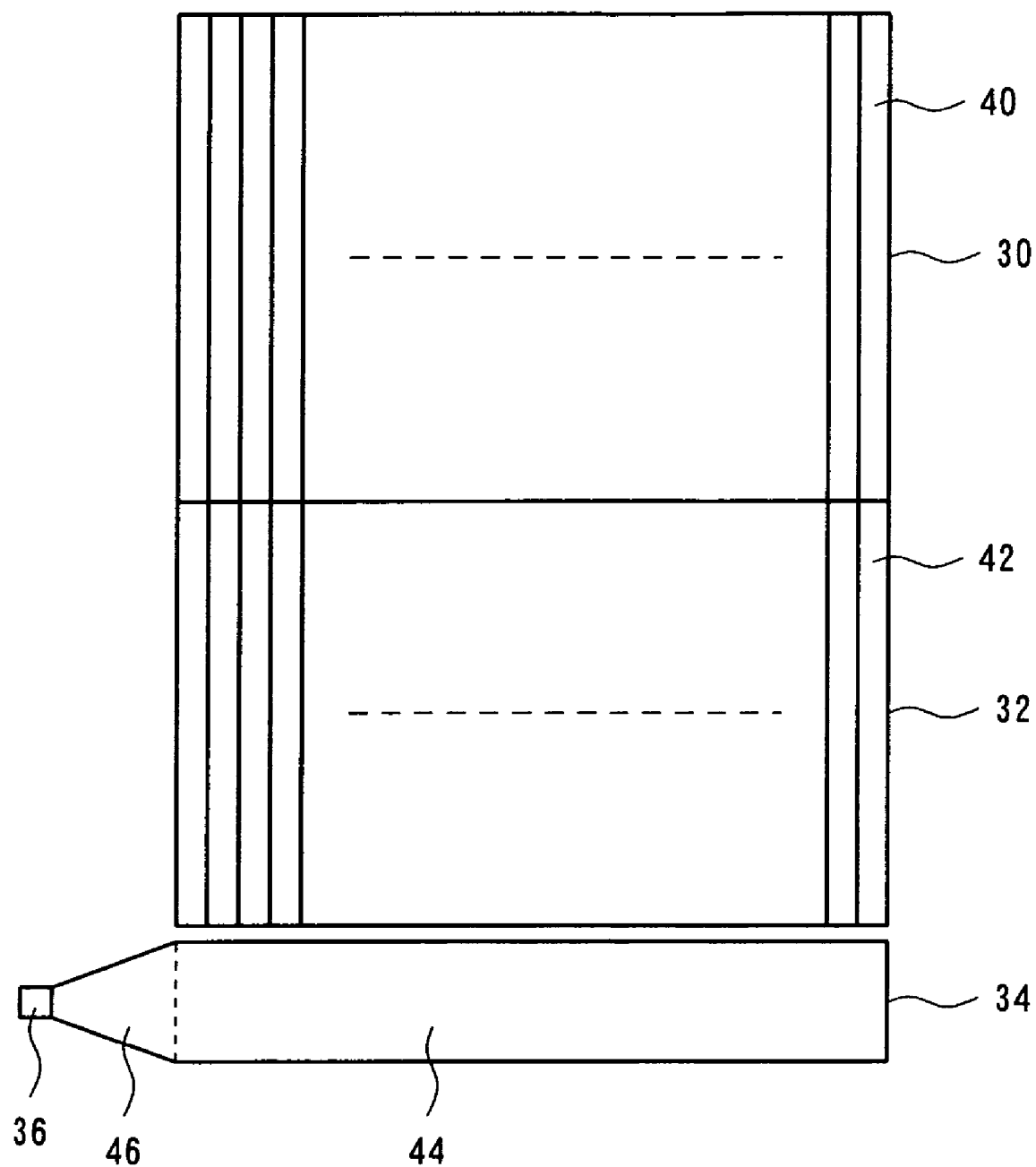
FIG. 2 is a schematic plan view showing a whole structure of a CCD image sensor according to an embodiment.

FIG. 2 is a schematic plan view showing a whole structure of a CCD image sensor according to the embodiment. The CCD image sensor is of a frame transfer type to comprise an imaging portion 30, a storage portion 32, a horizontal shift register 34, and an output portion 36.

The imaging portion 30 comprises a plurality of vertical shift registers 40 arranged in a horizontal direction. Also, the storage portion 32 comprises a plurality of vertical shift registers 42 provided corresponding to the respective vertical shift registers 40 and also arranged in the horizontal direction in the same manner as the vertical shift registers 40. The vertical shift registers 40, 42 successively transfer a signal charge, which is generated in pixels of the imaging portion 30 according to a quantity of received light, toward the horizontal shift register 34.

The horizontal shift register 34 comprises a main portion 44, which receives a signal charge from the vertical shift registers 42, and an extended portion 46 connected to a rear end of the main portion 44. Respective bits of the main portion 44 are connected to respective output ends of the vertical shift registers 42, and the main portion 44 stores a signal charge, which is output in parallel from a group of vertical shift registers, in corresponding bits. The extended portion 46 leads to the output portion 36 a signal charge transferred horizontally through the main portion 44. The horizontal shift register 34 comprises two Al wirings extended near by a channel region and transfer clocks $\phi 1$, $\phi 2$ are supplied by way of the wirings to respective transfer electrodes of the main portion 44 and the extended portion 46.

Figure 3:
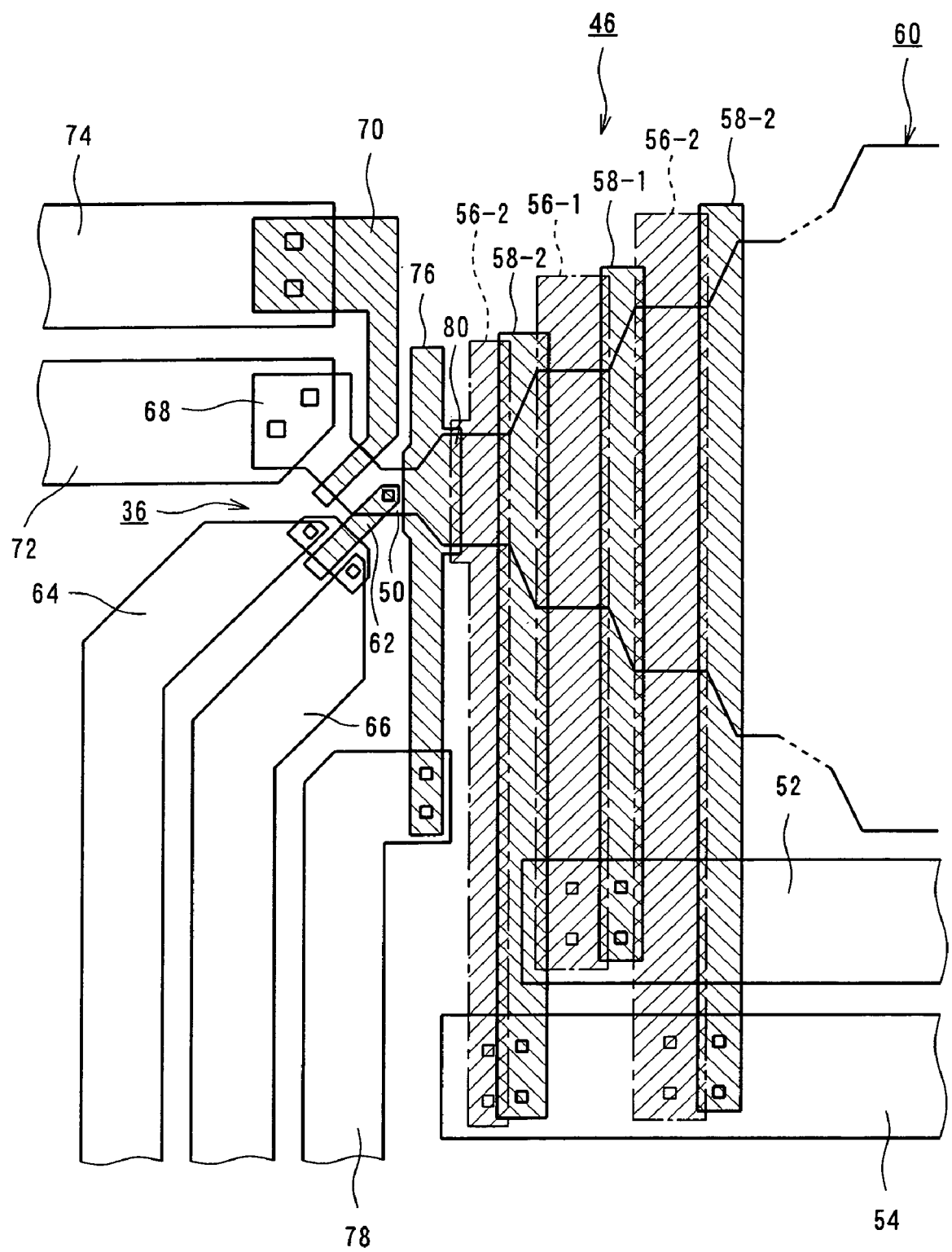
FIG. 3 is a schematic plan view showing the structure of an extended portion and an output portion, which are positioned on an output end side of a horizontal shift register according to the embodiment.

FIG. 3 is a schematic plan view showing the structure of the extended portion 46 and the output portion 36, which are positioned on an output end side of the horizontal shift register 34. The extended portion 46 is structured to narrow a channel width gradually toward the output portion 36. Owing to the structure, smooth transfer of a signal charge from the main portion 44 having a large channel width, to a FD 50 of the output portion 36 having a small size is achieved.

Incidentally, since a horizontal dimension of one bit of the horizontal shift register in the main portion 44 is minute corresponding to a horizontal pitch of a pixel, the channel width of the main portion 44 is determined to be large so as to enable the charge handling capacity. On the other hand, that variation in electric potential, which corresponds to signal charges, can be increased by decreasing a capacitance associated with the FD 50, so that the FD 50 is generally designed to be small in size. Consequently, the extended portion 46 gradually narrows its channel width. In addition, while the extended portion 46 is narrowed in channel width, the transfer electrodes are enlarged in width (dimension in a signal charge transfer direction) whereby a charge handling capacity is maintained in the extended portion 46.

The extended portion 46 is driven in two phases in the same manner as the main portion 44. Two Al wirings 52, 54 arranged in parallel to a channel region of the main portion 44 to supply transfer clocks $\phi 1$, $\phi 2$ are extended to the extended portion 46, and the transfer clocks $\phi 1$, $\phi 2$ are supplied to transfer electrodes of the extended portion 46 through the wirings 52, 54.

1st poly-Si electrodes 56 and 2nd poly-Si electrodes 58 are arranged as transfer electrodes in a channel region 60 alternately in the signal charge transfer direction. The respective electrodes 56, 58 have an elongate shape extending in a direction along the channel width and are arranged to bridge the channel region 60, both ends thereof extending to above a local oxidation of silicon (LOCOS) outside the channel region 60. In particular, one end of each respective electrode 56, 58 is extended to the wirings 52, 54 to be connected thereto.

The 1st poly-Si electrodes 56 and 2nd poly-Si electrodes 58 arranged alternately in the signal charge transfer direction are paired to correspond to one transfer clock. For example, a 2nd poly-Si electrode 58 and a 1st poly-Si electrode 56 nearer to the output portion 36 than the 2nd poly-Si electrode 58 make a pair of electrodes. Pairs of the electrodes are alternately connected to the wirings 52, 54. Specifically, a pair of the 1st poly-Si electrode 56-1 and the 2nd poly-Si electrode 58-1 are connected to the wiring 52, and a pair of the 1st poly-Si electrode 56-2 and the 2nd poly-Si electrode 58-2, which are positioned adjacent the former pair, are connected to the wiring 54. When the same voltage is applied to the 1st poly-Si electrodes 56 and the 2nd poly-Si electrodes 58, channel electric potential below the 1st poly-Si electrodes 56 is deeper than that below the 2nd poly-Si electrodes 58, so that a signal charge transfer direction toward the output end side is realized at the two transfer clocks $\phi 1$, $\phi 2$ by the structure of the pair of electrodes described above.

The output portion 36 comprises a FD 50, an output transistor that takes out electric potential of the FD 50 as electric signals, and a reset transistor that resets electric potential of the FD 50. The FD 50 comprises a N-type impurity diffusion layer and cooperates with a P-type impurity diffusion layer (P well) therebelow to form a PN junction diode.

The diode is reverse-biased by a reset transistor as described later to serve as a capacitor. A signal charge transferred to a last stage of the horizontal shift register is transferred to the FD 50, and the FD 50 varies electric potential according to the quantity of signal charge.

A gate electrode 62 of the output transistor is connected to the FD 50, and an output signal of the CCD image sensor is created on the basis of a source-drain current that varies according to the electric potential of the FD 50. Al wirings 64, 66, respectively, are connected to the source and the drain of the output transistor.

The reset transistor comprises the FD 50 and a reset drain (RD) 68 being a N-type diffusion layer adjacent thereto, as a source and a drain, and further comprises a reset gate (RG) 70 as a gate electrode that controls electric potential between the FD 50 and the RD 68. A predetermined reset voltage is supplied to the RD 68 through an Al wiring 72, and when reset pulse $\phi$RD applied to the RG 70 turns the reset transistor ON, the FD 50 is reset to electric potential of the RD 68. Incidentally, the RG 70 is made of polysilicon to be connected to that Al wiring 74, through which $\phi$RD is supplied.

The horizontal shift register comprises an OG 76 arranged between the last-stage transfer electrode 56-2, to which transfer clock is applied, and the FD 50. The OG 76 is made of polysilicon to be connected to that Al wiring 78, through which a certain reference voltage is supplied. Here, the OG 76 is made of 2nd poly-Si in order to restrict a gap between it and an adjacent 1st poly-Si transfer electrode 56-2.

The OG 76 comprises an overlap portion 80, which overlaps the transfer electrode 56-2 only in a portion thereof corresponding to the channel region, on an edge thereof facing the last-stage transfer electrode 56-2. By means of one of the provision of a convex portion, which projects toward the transfer electrode 56-2, on the OG 76 and the provision of a convex portion, which projects toward the OG 76, on the last-stage transfer electrode 56-2, or the both thereof, the overlap portion 80 is formed on the convex portion. A clearance is formed between the OG 76 and the transfer electrode 56-2 except in that location, in which the convex portion is provided. In particular, in that location, in which the OG 76 and the transfer electrode 56-2, respectively, are extended relatively lengthily toward the wiring 78 and the wiring 54, the both electrodes are extended in parallel to each other without overlapping each other. In this manner, since capacitance between the both electrodes is reduced by limiting overlap of the both electrodes in a position corresponding to the channel region, variation of channel electric potential below the OG 76 under the influence of transfer clock $\phi 2$ applied to the transfer electrode 56-2 is suppressed and noise reduction is achieved.

In addition, that convex portion, which forms the overlap portion 80, may be enlarged to a certain extent outside the channel region 60 according to that possible misalignment of photomask arising in the process to form the OG 76 and the transfer electrodes 56 by means of the lithography technique.

With the structure shown in FIG. 3, while the 1st poly-Si electrodes 56 and the 2nd poly-Si electrodes 58, which are adjacent to each other and to which transfer clocks of different phases are applied, overlap each other in any location in a direction of channel width in the same manner as a conventional structure, the same structure as that of the OG 76 and the last-stage transfer electrode 56-2 is applicable to the electrodes 56, 58. That is, while convex portions are provided on those portions of the electrodes 56, 58, which correspond to the channel region, to generate overlap between the electrodes, capacitance between the electrodes can be reduced by providing a clearance between the electrodes in a major portion except the channel region. Consequently, the transfer efficiency, the charge handling capacity, and the like are ensured in the extended portion 46.

Also, while the structure shown in FIG. 3 is of a so-called two-phase drive system, in which adjacent transfer electrodes are paired and transfer clocks of the phase are applied thereto, it may be of another drive system, in which transfer clocks of different phases are applied to adjacent transfer electrodes.

An explanation has been given to a CCD image sensor being a solid-state imaging apparatus according to the invention, centering on a structure, which comprises a horizontal shift register formed on a semiconductor substrate to transfer signal charges read in a charge transfer channel from an imaging portion by means of a plurality of transfer electrodes, to which transfer clocks are applied, and a charge detection region that converts the signal charges output from the horizontal shift register into a voltage signal, the structure comprising an output end side channel region being an output-side end of the charge transfer channel, an output gate electrode arranged adjacent to the transfer electrode in the last stage and on a boundary portion of the output end side channel region and the charge detection region to maintain the boundary portion at a predetermined reference electric potential, the output gate electrode comprising a portion that overlaps the transfer electrode in the last stage, and the overlap portion being selectively formed in a position corresponding to the output end side channel region with respect to a direction of channel width.

Also, the invention is not limited to a CCD image sensor but applicable to CCD itself. The CCD according to the invention comprises a charge transfer channel region formed on a surface of a semiconductor substrate, and a first transfer electrode and a second transfer electrode, respectively, which intersect the charge transfer channel region, have a portion that overlaps mutually, and are arranged adjacent to each other to control electric potential in the charge transfer channel region, the overlap portion being selectively formed in a position corresponding to the charge transfer channel region with respect to a direction of channel width. In the explanation described above, for example, a pair of the 1st poly-Si electrode 56-1 and the 2nd poly-Si electrode 58-1 form the first transfer electrode (or the second transfer electrode), and a pair of the 1st poly-Si electrode 56-2 and the 2nd poly-Si electrode 58-2 form the second transfer electrode (or the first transfer electrode). Further, portions, in which the 1st poly-Si electrode 56-1 and the 2nd poly-Si electrode 58-2 overlap, or portions, in which the 1st poly-Si electrode 56-2 and the 2nd poly-Si electrode 58-1 overlap, can be selectively formed in a position corresponding to the channel region.

An example of the CCD according to the invention comprises a charge detection region that receives electric charges output from the charge transfer channel region and generates a change in electric potential corresponding to a quantity of the electric charges, the charge transfer channel region being gradually narrowed in channel width to be connected to the charge detection region, the first transfer electrode being a output gate electrode arranged at an output end of the charge transfer channel region to maintain the output end at a predetermined reference electric potential, and the second transfer electrode being a last-stage electrode out of those transfer electrodes, to which a transfer clock is applied.

According to the invention, since overlap of that transfer electrode, to which a transfer clock is applied, or an output gate electrode and a transfer electrode adjacent thereto outside a channel region is limited, capacity coupling between the electrodes is reduced. Consequently, influences on channel electric potential below adjacent transfer electrodes when a transfer clock is applied on a certain transfer electrode are reduced, and noise reduction or the like is achieved on an output signal.

What is claimed is:

1. A CCD (charge coupled device) comprising:
   a charge transfer channel region formed on a surface of a semiconductor substrate;
   a first transfer electrode and a second transfer electrode, respectively, which intersect the charge transfer channel region, comprise a portion that overlaps mutually, and are arranged adjacent to each other to control an electric potential in the charge transfer channel region, and
   a charge detection region that receives electric charges output from the charge transfer channel region and converts the electric charges into an output voltage signal of the CCD, wherein
   the first transfer electrode is a last-stage electrode out of those transfer electrodes, to which a transfer clock is applied;
   the second transfer electrode is an output gate electrode arranged adjacent to the last stage electrode and on a boundary portion of an output end of the charge transfer channel region and the charge detection region to maintain the boundary portion at a predetermined reference electric potential;
   a first electrode that is one of the last-stage electrode and the output gate electrode, the first electrode having a first salient portion that is selectively formed in a position corresponding to the charge transfer channel region with respect to a direction of channel width, and projecting toward a second electrode that is the other one of the last-stage electrode and the output gate electrode:

a leading end portion of the first salient portion having a straight edge that intersects the charge transfer channel region and overlaps the second electrode; and a clearance is formed in planar direction between the output gate electrode and the last stage electrode except a place where the leading end portion overlaps.

2. The CCD according to claim 1, wherein the second electrode has a second salient portion that is selectively formed in a position corresponding to the charge transfer channel region with respect to a direction of channel width and projects toward the first electrode; and a leading end portion of the second salient portion has a straight edge that intersects the charge transfer channel region and overlaps the leading end portion of the first salient.

3. A solid-state imaging apparatus comprising a horizontal shift register formed on a semiconductor substrate to transfer signal charges read in a charge transfer channel region from an imaging portion by means of a plurality of transfer electrodes, to which transfer clocks are applied, and a charge detection region that converts the signal charges output from the horizontal shift register into a voltage signal, the solid-state imaging apparatus further comprising:

an output end side channel region being an output-side end of the charge transfer channel region; and an output gate electrode arranged adjacent to a last-stage electrode out of the transfer electrodes and on a boundary portion of the output end side channel region and the charge detection region to maintain the boundary portion at a predetermined reference electric potential, wherein a first electrode that is one of the last-stage electrode and the output gate electrode, the first electrode having a first salient portion that is selectively formed in a position corresponding to the charge transfer channel region with respect to a direction of channel width, and projecting toward a second electrode that is the other one of the last-stage electrode and the output gate electrode;

a leading end portion of the first salient portion having a straight edge that intersects the charge transfer channel region and overlaps the second electrode; and a clearance is formed in planar direction between the output gate electrode and the last stage electrode except a place where the leading end portion overlaps.

4. The solid-state imaging apparatus according to claim 3, wherein the second electrode has a second salient portion that is selectively formed in a position corresponding to the charge transfer channel region with respect to a direction of channel width and projects toward the first electrode; and a leading end portion of the second salient portion has a straight edge that intersects the charge transfer channel region and overlaps the leading end portion of the first salient.

* * * * *